United States Patent
Waehner

[11]B 3,982,240
[45] Sept. 21, 1976

[54] BIPOLAR A/D CONVERTER USING TWO COMPARATORS

[75] Inventor: Glenn C. Waehner, Riverside, Conn.

[73] Assignee: United Technologies Corporation, Hartford, Conn.

[22] Filed: Sept. 19, 1974

[21] Appl. No.: 507,647

[44] Published under the second Trial Voluntary Protest Program on January 27, 1976 as document No. B 507,647.

[52] U.S. Cl. .......................... 340/347 AD; 324/99 D
[51] Int. Cl.² ...................................... H03K 13/06
[58] Field of Search .............. 340/347 AD; 307/236

[56] References Cited
UNITED STATES PATENTS

| | | | |
|---|---|---|---|
| 3,505,668 | 4/1970 | Ottesen | 340/347 AD |
| 3,544,993 | 12/1970 | Gabriel | 340/347 AD |
| 3,657,653 | 4/1972 | Wilkinson | 340/347 AD |
| 3,718,923 | 2/1973 | Horwitz et al. | 340/347 NT |

Primary Examiner—Thomas J. Sloyan
Attorney, Agent, or Firm—M. P. Williams

[57] ABSTRACT

Elimination of an inverting amplifier and a video switch, which provide selective polarity reversal to permit usage of unipolar A/D conversion in prior art bipolar A/D converters, for improved economy and performance, is achieved by usage of two comparators, one for comparing positive input signals and one for comparing negative input signals, the output of one of the comparators, at any one time, providing the input to unipolar A/D converter successive approximation logic, and establishing the sign of the result.

3 Claims, 2 Drawing Figures

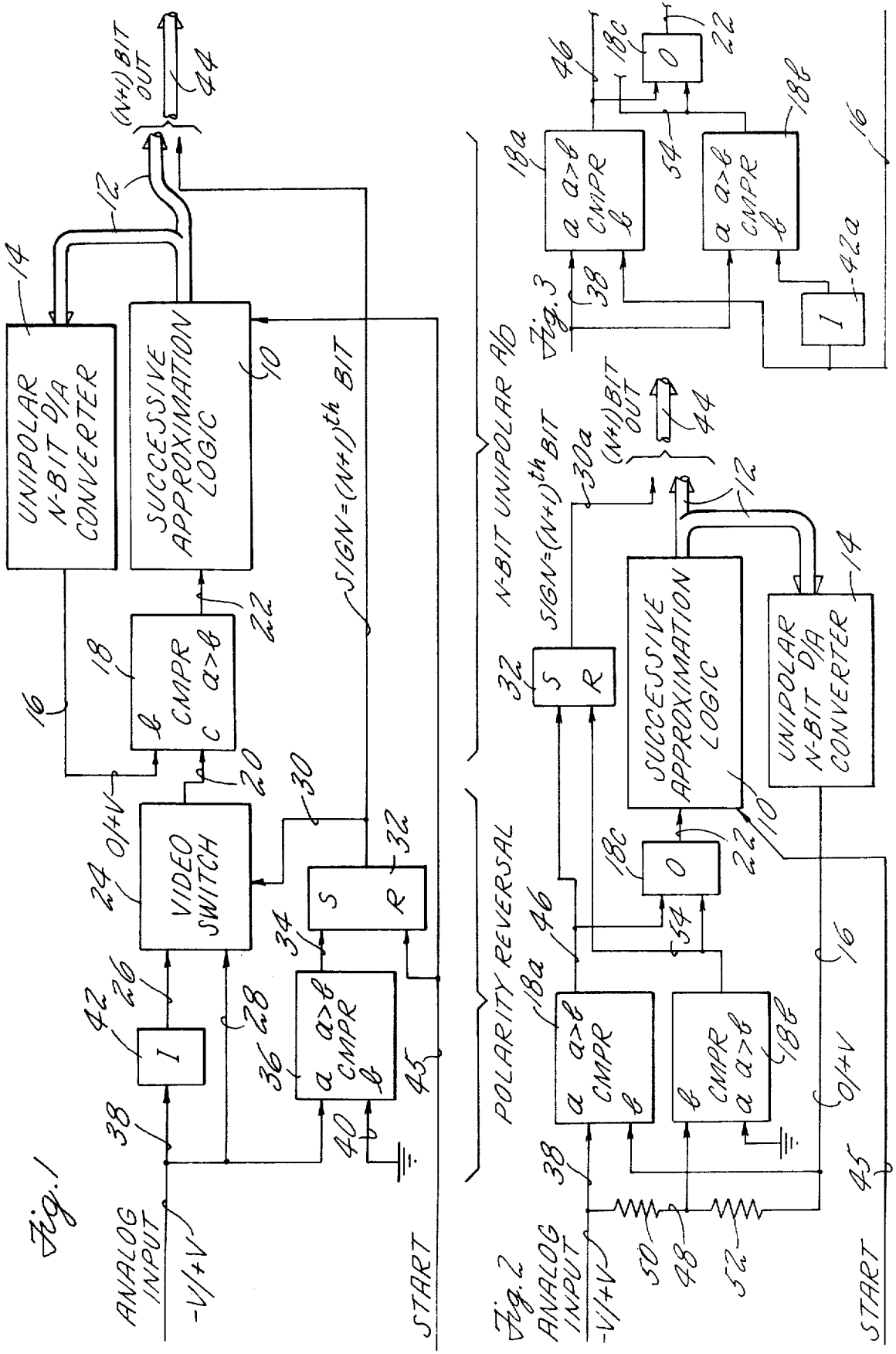

BIPOLAR A/D CONVERTER USING TWO COMPARATORS

BACKGROUND OF THE INVENTION

1. Field of Invention

This invention relates to A/D conversion, and more particularly to improved bipolar A/D conversion employing dual comparators with unipolar A/D conversion circuitry.

2. Description of the Prior Art

As is discussed more fully hereinafter with respect to the drawing, a common form of bipolar analog to digital (A/D) conversion circuitry employs selective polarity reversal at the input of a unipolar A/D conversion circuit. However, selective polarity reversal is achieved by means of a combination of an inverting video amplifier and a video switch ("video" simply meaning wideband analog), which selects between the uninverted analog input and the inverted analog provided at the output of the inverting amplifier. The video switch is very expensive and, in conjunction with the amplifier degrades performance due to slew rate (phase shift as a function of rates of change of input signals) and level offset, etc. Since the conversion can't begin until the polarity is tested, the switch is reversed and settled (as necessary), considerable time is lost, thus reducing the speed of conversion.

SUMMARY OF INVENTION

An object of the invention is to substantially reduce the cost of bipolar analog to digital conversion. Another object is to provide significant improvement in performance of bipolar analog to digital conversion circuitry employing unipolar A/D converters.

According to the present invention a bipolar analog to digital conversion apparatus including unipolar successive approximation logic, the digital output of which is converted to analog in a unipolar D/A converter, employs two comparators, one of which compares positive values of the analog input with the analog output of the D/A converter and the other of which compares negative values of analog input to the analog output of the D/A converter, one or the other of the outputs of the converters providing the sign bit and the increment signal to the successive approximation logic. In accordance further with the present invention, one of the comparators compares the direct analog input and provides a signal when it is greater than the output of the D/A converter, and the other of the comparators compares the sum of the direct analog input and the output of the D/A converter with ground, or other reference potential. In still further accord with the present invention, the incrementing bit input to the successive approximation logic comprises the logical OR of the outputs of the two comparators. In still further accord with the present invention, at the end of the conversion cycle, the sign bit is taken to be positive if the final approximation iteration provided an output of the positive or direct comparator, and to be negative if the final iteration of approximation provided an output of the indirect or negative comparator.

The invention provides conversion which begins instantaneously, with no loss of time to polarity testing and reversal, thus providing much higher conversion rates.

The present invention eliminates the need for an inverting amplifier and a video switch, requiring only a logical OR circuit and a two-signal resistor summing network as substitutes therefor. The present invention avoids problems such as voltage level offsets, switch timing, phase excursion and noise, by elimination of an input amplifier and video switch for selective polarity reversal. The invention similarly reduces costs since the logical OR circuit and two-signal summing network are far less expensive than the video switch and inverting amplifier which are eliminated. The invention facilitates improved bipolar conversion utilizing the same comparator circuits, successive approximation logic, and unipolar digital to analog conversion as are utilized in the prior art devices requiring selective polarity reversal circuitry at the input thereof.

Other objects, features and advantages of the present invention will become more apparent in the light of the following detailed description of a preferred embodiment thereof, as illustrated in the accompanying drawing.

BRIEF DESCRIPTION OF THE DRAWING

FIG. 1 is a schematic block diagram of a bipolar analog to digital conversion circuit known to the prior art; and FIG. 2 is a schematic block diagram of an embodiment of the improved bipolar analog to digital conversion circuit in accordance with the present invention.

DESCRIPTION OF THE PREFERRED EMBODIMENT

Referring now to FIG. 1, a prior art digital to analog converter which is responsive to bipolar analog input signals (those in which the analog input signal can be positive or negative with respect to ground or other reference potential) includes, as is well known in the art, successive approximation logic circuitry 10 which provides an N-bit digital output on a plurality of signal lines 12, which comprises a digital representation of an analog input signal being converted; the output on signal lines 12 represent a trial digital answer of the conversion process, and are also applied to a unipolar N-bit digital to analog converter circuitry 14 of any conventional type which is well known in the art. The D/A converter 14 provides an analog signal on its output line 16 for comparison in a comparator circuit 18 with an analog input signal on the line 20. The comparison circuit 18 will provide a signal on its output line 22 to the input of the successive approximation logic 10 whenever the analog input signal on the line 20 is greater than the analog conversion circuit signal on the line 16, indicating that the successive approximation logic 10 has not yet approximated, in its digital output on the signal lines 12, a value commensurate with the amplitude of the analog input signal on the line 20. The circuitry 10-22 comprises a well-known form of unipolar analog to digital conversion circuitry.

In order to use unipolar analog to digital conversion circuitry for the conversion of bipolar analog input signals, it is necessary to convert the bipolar input into a unipolar input (so that analog signals which may be positive or negative with respect to ground or other reference potential will be applied to the unipolar A/D conversion circuit only in a single polarity, either positive or negative in all cases).

In the prior art bipolar conversion circuit of FIG. 1 selective polarity reversal is provided by the combination of a video switch 24 which selects between an inverted signal on a line 26 and a noninverted signal on a line 28, in dependence upon a sign-bit signal on a line 30 which is provided by a bistable device 32. The bistable device 32 is in turn controlled by a signal on an output line 34 of a comparison circuit 36 which compares the analog bipolar analog input signal on a line 38 with a reference potential, such as ground, on a line 40. The inverted analog input on the line 26 is provided by an inverting amplifier 42, which may typically comprise a linear video amplifier having a gain of minus unity. Whenever the analog input on the line 38 is positive, the (a) input of the comparator 36 will be larger than the (b) input, so that there will be an output signal on the line 34, which sets the bistable device 32 and provides a signal on the line 30. This will cause the video switch 24 to connect the uninverted input on the line 28 to its output on the line 20 for comparison with the analog conversion signal on the line 16. It also provides the sign bit indicating that the analog input is positive, which can be utilized as the highest ordered bit of the digital output on lines 44, along with the digital output signals on the trunk of lines 12 from the successive approximation logic 10. On the other hand, whenever the analog input signal on the line 38 is negative with respect to ground, then the comparator 36 will not provide the output signal on the line 34, so there will be no signal on the line 30. The bistable device 32 is reset in synchronism with A/D conversion by a start signal on a line 45. This will cause the video switch to connect the inverted analog signal on the line 26 to its output on line 20 for comparison with the analog conversion signal on the line 16. Of course, the polarities may be reversed such that the latch is set in response to a negative signal and the video switch might normally connect the uninverted analog input to the line 20 and transfer in response to a negative input indicated by a signal on the line 30, all as is totally immaterial to the invention and well known in the art.

Problems with the circuit of FIG. 1 include the fact that the inverting amplifier 42 must be extremely linear and have zero DC offset drift. It also must, in conjunction with the video switch 24, contribute little if any noise into the circuitry, and not provide level offsets with respect to the video switch 24. The video switch 24 and the amplifier 42 are relatively expensive, as well as reducing performace of the overall circuit. This polarity reversal circuitry affects the accuracy of the positive conversion, and has a further effect on conversion resulting from inversion of the analog signal; in addition, it contributes to a different scale factor for positive and negative analog input signals. More importantly, polarity comparison and switching, along with amplifier response time may consume as much as one-third of the conversioncycle time.

The present invention overcomes these difficulties by eliminating the video switch 24 and the inversion circuit 42. Comparators, which may be the same as the comparators 18 and 36, a bistable device, which may be the same as the bistable device 32, and the conventional successive approximation logic, such as the logic 10, may be used in conjunction with a conventional unipolar digital to analog converter such as a converter 14 to provide improved results.

Referring to FIG. 2 elements which perform the same function bear the same reference numerals as those in FIG. 1, and elements which perform analogous function bear similar reference numerals with letter subscripts. In FIG. 2, the successive approximation logic 10 provides digital inputs to the D/A converter 14, the output of which on the line 16 is used for comparison with the input signal, the approximation logic being incremented in response to a signal on the line 22, all as described with respect to FIG. 1, hereinbefore. Similarly, the sign-bit latch 32 provides at its output line 30a, a signal indicating the sign of the conversion cycle.

In FIG. 2, one of the comparator circuits 18a is connected so as to compare the analog input signal on the line 38 to see if it is greater than the analog coversion signal on the line 16 so as to provide a signal on a line 46 whenever the analog input signal on the line 38 is more positive than the analog conversion signal line 16. As is described more fully hereinafter, since the output of the digital to analog converter 14 is always between reference and positive, this means that the comparator 18a will provide an output signal on the line 46 whenever the analog input signal on the line 38 is positive and of greater magnitude than the analog conversion circuit signal on the line 16. On the other hand, a comparator 18b has its inputs connected to ground or other reference potential and to a summing junction 48 of a summing network including two equal resistors 50, 52 which can be of a value chosen for a suitable scale factor with respect to the effective input impedance of the comparator 18b, as is well known in the art. In only one case will the comparator 18b provide an output signal on line 54: that is when the analog input signal on the line 38 is more negative and has a greater amplitude than the analog conversion signal on the line 16 such that the junction 48 is negative, and therefore the (a) input to the comparator 18b is more positive than the (b) input thereto.

Thus, for positive analog input signals, a signal appears on the line 46 which is passed through an OR circuit 18c to provide the incrementing signal on the line 22 to the successive approximation logic 10. On the other hand, whenever there is a negative analog input signal on the line 38 which is of greater magnitude than the analog conversion signal on the line 16, the converter 18b will provide a signal on the line 54 to the OR circuit 18c. It is immaterial which if these two signals operates the OR circuit 18c, since in either case the magnitude is greater at the input than has been achieved by the successive approximation logic, so that it should respond to a signal on the line 22 to increment its output. In addition, the comparator 18a will set a bistable device 32 to provide a positive sign at its output 30a, whereas the comparator 18b will reset the bistable device 32 so as to indicate a negative sign at the output thereof by the absence of the signal on the line 30a. Certainly, the polarities can be reversed as is well known in the art. All of the apparatus used herein is well known and readily available in the market. For instance, the successive approximation logic may be purchased under the trade designation AM2502SAR from Advanced Micro Devices; Sunnyvale, Calif.; the digital to analog 14 may be purchased under the trade designation 5656 from Hybrid Systems Corp.; Burlington, Mass.; the comparators 18a, 18b may, for instance, comprise those available under the designation LM 111 from National Semiconductor; Santa Clara, Calif.

As is illustrated in FIG. 2, the summing resistors 50, 52 and the comparator 18b comprise means for providing a signal indicative of the input signal being of a polarity opposite from and of a magnitude greater than that of the conversion signal. Instead, this may be comprised, as illustrated in FIG. 3, of an inverter 42a, for inverting the conversion signal on the line 16, together with the comparator 18b. Or, the inverter 42a could invert the input signal instead, in a fashion which is obvious in view of FIG. 3. The inversion requires an amplifier, so this embodiment only achieves the advantages of switch elimination.

Similarly although the invention has been shown and described with respect to preferred embodiments thereof, it should be understood by those skilled in the art that the foregoing and various other changes, omissions and additions thereto may be made therein without departing from the spirit and the scope of the invention.

Having thus described typical embodiments of my invention, that which I claim as new and desire to secure by Letters Patent of the United States is:

1. Bipolar analog to digital conversion apparatus for providing a digital manifestation of an analog input signal, comprising:
    successive approximation logic means for providing a digital output signal manifestation, said means responsive to an incrementing input signal to increment the digital value at its output;
    digital to analog conversion means responsive to the output of said successive approximation logic means for providing an output signal which comprises an analog manifestation of the value of the digital output of said successive approximation logic;
    first comparator means, responsive to the analog input signal and to the output of said digital to analog conversion means, for providing a first output signal indicative of the analog input signal being of the same polarity as and greater in magnitude than the output of said digital to analog conversion means;
    means for summing the input signal and the output of said digital to analog conversion means to provide a sum-signal manifestation of said signals;
    second comparator means, responsive to said sum signal and a reference potential, for providing a second output signal when said sum signal has a polarity with respect to said reference potential which is opposite to that of the output of said digital to analog conversion means; and
    means responsive to both of said comparator means for providing said incrementing signal input to said successive approximation logic means.

2. Bipolar analog to digital conversion apparatus according to claim 1 additionally comprising:
    means settable in either of two stable states to represent the sign of the analog input signal, said means being settable in a first state in response to the output signal from said first comparator means and being set into a second state in response to an output from said second comparator means.

3. Bipolar analog to digital conversion apparatus according to claim 1 wherein said last named means comprises a logic OR circuit responsive to the output of both of said comparator means, the output of which is applied as the incrementing signal input to said successive approximation logic means.

* * * * *